United States Patent
Pongracz et al.

(10) Patent No.: US 6,174,196 B1
(45) Date of Patent: Jan. 16, 2001

(54) LOW-COST MULTI-SHELF CABLING ARRANGEMENT

(75) Inventors: David John Pongracz, Bangor, PA (US); Michael P. Tippner, Cedar Knolls, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/163,196

(22) Filed: Sep. 30, 1998

(51) Int. Cl.[7] .......................... H01R 11/00; H01R 13/44
(52) U.S. Cl. ................................. 439/502; 439/130
(58) Field of Search .................... 439/502, 505, 439/130; 361/826, 788, 791; 307/12

(56) References Cited

U.S. PATENT DOCUMENTS 4,626,846 * 12/1986 Parker et al. ............... 340/825.52
5,128,855 * 7/1992 Hilber et al. ..................... 364/132
5,308,926 * 5/1994 Auerbuch et al. ................ 174/250
5,897,399 * 4/1999 Emery ............................. 439/709

* cited by examiner

Primary Examiner—Brian Sircus
Assistant Examiner—Chandrika Prasad

(57) ABSTRACT

An inexpensive cable is utilized to permit multiple identical shelves in a bay of interface units to be wired for a plurality of signals by utilizing conventional twenty-five pin wiring. Hand-wired dedicated cables normally used for routing alarm signals are avoided. Printed wiring backplanes are utilized for connecting the common signals together and for permitting appropriate connections for the plurality of individual signals to be connected to the appropriate interface units positioned in the bay. The backplanes have an identical pattern so that the interface units can be used interchangeably.

15 Claims, 2 Drawing Sheets

LOW-COST MULTI-SHELF CABLING ARRANGEMENT

BACKGROUND OF THE INVENTION

1. Field of the Invention

To provide a wiring cable connector with a cross-over backplane wiring to enable a single cable to be utilized for connecting a group of signals from an interface circuit to a central location.

2. Description of Background Art

Hithertofore, a unique hand-wired cable system was needed to permit a plurality of interface units to be wired back to a central location. More specifically, common sensors at the interface unit would require a common cable to be hand-wired from the common sensors by utilizing T-connections and thereafter be wired back to the central location to permit common signals or common alarm signals to be transferred back to the central location.

For example, if four interface units are arranged on four shelves, it would normally be necessary to hand-wire one common cable with wires for connecting the common signals connected by T-connections to the four interface units. The common signals could be common alarm signals such as an electrical failure, battery on discharge, etc. In addition, four cables would be necessary for unique signals connected to the four interface units. The unique signals could be alarm signals dedicated to specific or unique alarms such as door open or fan failure for each of the four central terminal units.

The complicated hand-wiring for the common signals and the use of dedicated cables for each of the interface units is expensive.

SUMMARY AND OBJECTS OF THE INVENTION

It is an object of the present invention to design a connection system with a cross-over backplane to permit common signals and unique signals to be connected from an interface unit to a central location.

It is a further object of the present invention, to permit an inexpensive, conventional cable to be used to permit multiple interface units to be wired for a plurality of signals by utilizing conventional twenty-five pin wiring.

The present invention avoids the need to hand-wire dedicated cables for use to route signals. In addition, it is not necessary to form T-connections to permit cross-connection of the common signals.

The present invention permits the use of printed paths on a multi-layer back-plane to be disposed in the in and out connections for connecting the common signals together and for permitting appropriate connections for the plurality of individual signals to be connected to the appropriate interface units.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
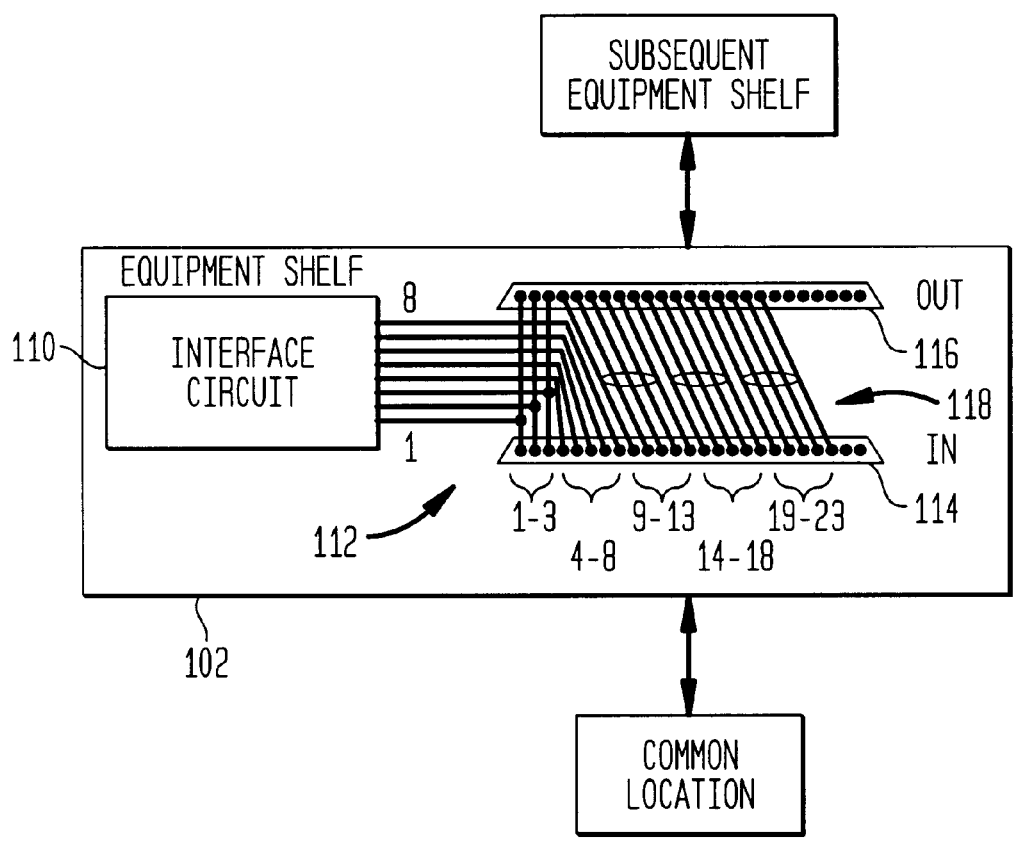
FIG. 1 is a backplane wiring overview illustrating a wiring connection for an interface unit wherein three common signals and five unique signals from the interface unit are connected to a central location.

As illustrated in FIG. 1, a shelf 102 includes an interface circuit 110 operatively connected on the backplane to an input lead (IN) 114 and an output lead (OUT) 116. The input lead (IN) 114 is a conventional 25 pin connector that can be easily connected to a conventional 25 pin input lead secured to a cable. The 25 pin connector (IN) 114 includes pins 1–23 that correspond to bay cable designations for producing signals 1–23. In addition, the 25 pin connector (IN) 114 includes two blank pins. The interface circuit 110, the input lead 114, the output lead 116, and a preselected printed wiring backplane 118 comprise an interface unit 112.

Figure 2:
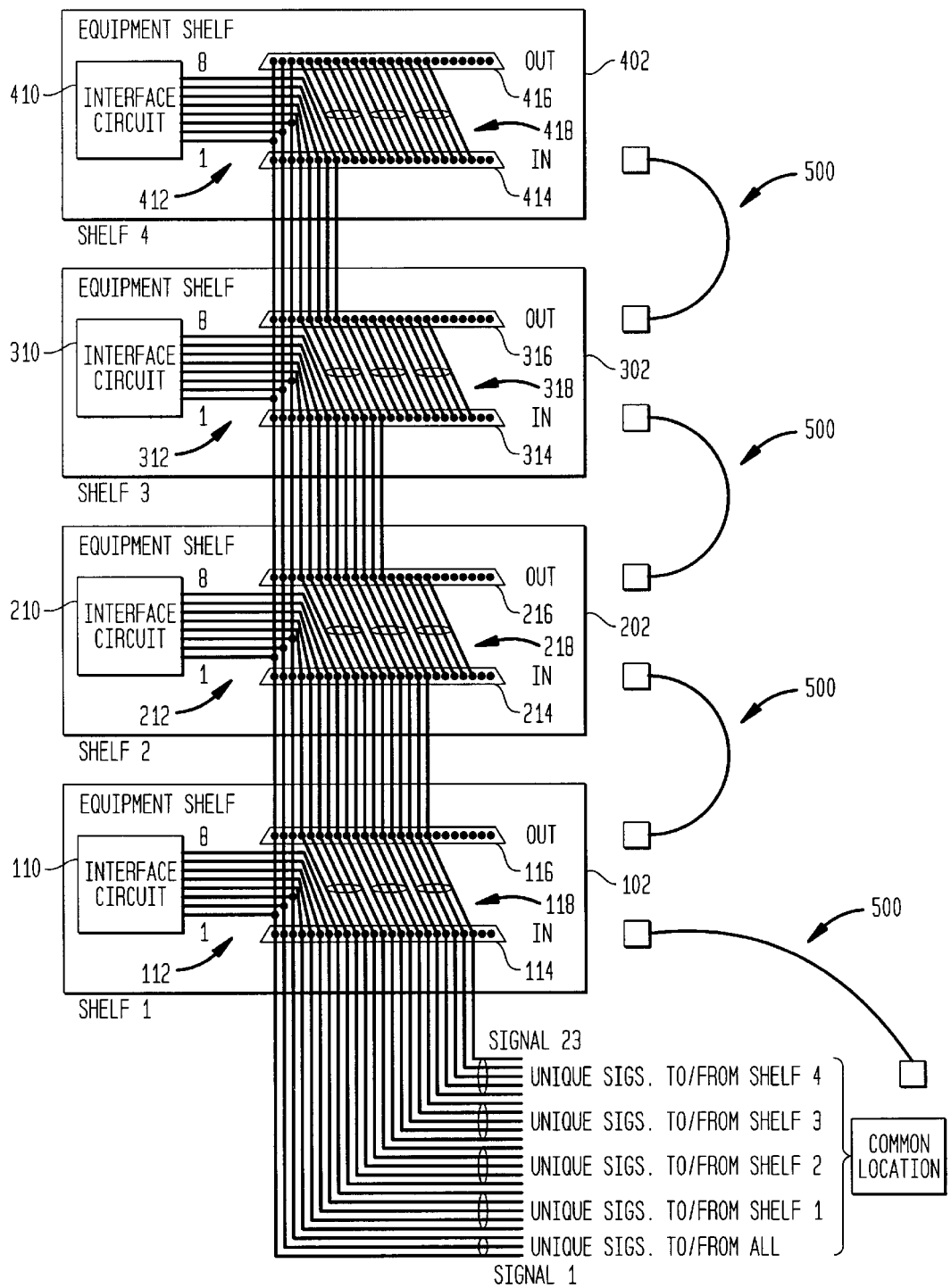
FIG. 2 illustrates a bay wiring supporting three common inputs and five unique inputs from each of the interface units positioned on each of four shelves to be connected to a central location.

As illustrated in FIG. 2 and Table 1, four interface units 112, 212, 312 and 412 are located on four identical equipment shelves 102, 202, 302 and 402. In operation each interface circuit 110, 210, 310, 410 includes eight inputs. The 25 pin connector 114 is connected by means of a conventional cable to send signals from the interface units to a central location. As set forth in Table 1, three of the signals 1 to 3 are common signals for all four interface units 112, 212, 312 and 412 positioned on the shelves 102, 202, 302 and 402. For example, the common signals could be common alarms signals for representing an electrical failure, battery on discharge or other alarm signals that would be common to all four interface units. Five of the signals could be unique alarm signals for each of the individual interface units 112, 212, 312 and 412 such as door open, fan failure or other alarm signals that would be unique to each of the individual interface units 112, 212, 312 and 412.

With reference to Table 1, the first three bay cable designations 1 to 3 correspond to the first three pins 1–3 and permit signals 1 to 3 to be connected to the central location that are common signals for the interface unit 112 located on a first shelf 102. The subsequent five bay cable designations 4 to 8 correspond to the pins 4–8 and permit signals 4 to 8 to be connected to the central location that are unique alarm signals for the interface unit 112.

The next five bay cable designations 9 to 13 correspond to the pins 9–13 and permit signals 9 to 13 to be connected to the central location that are unique signals for the interface unit 212.

The following five bay cable designations 14 to 18 correspond to the pins 14–18 and permit signals 14 to 18 to be connected to the central location that are unique signals for the interface unit 312.

The five bay cable designations 19 to 23 correspond to the pins 19–23 and permit signals 19 to 23 to be connected to the central location that are unique signals for the interface unit 412.

As illustrated in FIGS. 1 and 2, the output lead (OUT) connector 116 is a conventional 25 pin connector that can easily be connected to a conventional 25 pin output lead secured to a cable. The 25 pin connector (OUT) connector 116 includes pins 1–18 that are wired by means of a cross-over printed path on a multi-layer backplane 118 to the (IN) connector 114 to configure the pins 1–18 of the (OUT) connector 116 to correspond to alarm signals 1 to 3 and 9 to 23.

The pins 9–18 of the (OUT) connector 116 correspond to signals 14 to 23 that are unique signals for the interface units 312 and 412. In addition, the output lead (OUT) connector 116 includes seven blank pins, 19–25.

In addition, as illustrated in FIG. 2 the (IN) connector 214 is connected to the (OUT) connector 116 to enable signals from the first three bay cable designations 1 to 3 corresponding to the first three pins 1–3 to permit signals 1 to 3 to be connected to the central location that are common signals for the interface unit 212 located on a second shelf 202. The subsequent five bay cable designations 4 to 8 correspond to the pins 4–8 and permit signals 9 to 13 to be connected to the central location that are unique signals for the interface unit 212.

The 25 pin connector (OUT) connector 216 includes pins 1–13 that are wired by means of a cross-over printed path on a multi-layer backplane 218 to the (IN) connector 214 to configure the pins 1–13 of the (OUT) connector 216 to correspond to signals 1 to 3 and 14 to 23. The (OUT) connector 216 includes seven blank pins.

In addition, as illustrated in FIG. 2 the (IN) connector 314 is connected to the (OUT) connector 216 to enable signals from the first three bay cable designations 1 to 3 corresponding to the first three pins 1–3 to permit signals 1 to 3 to be connected to the central location that are common signals for the interface unit 312 located on the third shelf 302. The subsequent five bay cable designations 4 to 8 correspond to the pins 4–8 and permit signals 14 to 18 to be connected to the central location that are unique signals for the interface unit 312.

The 25 pin connector (OUT) connector 316 includes pins 1–8 that are wired by means of a cross-over printed path on a multi-layer backplane 318 to the (IN) connector 314 to configure the pins 1–8 of the (OUT) connector 316 to correspond to signals 1 to 3 and 19 to 23. Pins 9–18 of the (OUT) connector 316 are wired by means of a cross-over printed path on the multi-layer backplane 318 to pins 14–23 of the (IN) connector 314. The (OUT) connector 316 includes seven blank pins 19–25.

In addition, as illustrated in FIG. 2 the (IN) connector 414 is connected to the (OUT) connector 316 to enable signals from the first three bay cable designations 1 to 3 corresponding to the first three pins 1–3 to permit signals 1 to 3 to be connected to the central location that are common signals for the interface unit 412 located on a fourth shelf 402. The subsequent five bay cable designations 19 to 23 correspond to the pins 4–8 and permit signals 19 to 23 to be connected to the central location that are unique signals for the interface unit 412.

The 25 pin connector (OUT) connector 416 includes pins 1–3 that are wired by means of a cross-over printed path on a multi-layer backplane 418 to the (IN) connector 414 to configure the pins 1–3 of the (OUT) connector 416 to correspond to signals 1 to 3. Pins 4–18 of the (OUT) connector 416 are wired by means of a cross-over printed path on the multi-layer backplane 418 to pins 9–23 of the (IN) connector 414. The (OUT) connector 416 includes seven blank pins 19–25.

From a review of the system printed wiring backplane for the interface units as illustrated in FIG. 2, the cross-over printed paths on the backplanes 118, 218, 318 and 418 for the connectors 114, 116; 214, 216; 314, 316 and 414, 416 are identical to enable the first three pins of all of the connectors to be utilized for three common signals for each of the interface units 112, 212, 312 and 412. As the interface units are connected to interface units on adjacent shelves, the subsequent five pins are shifted over to permit signals 4 to 8, 9 to 13, 14 to 18 and 19 to 23 to be connected to a central location that correspond to unique signals for respective interface units 112, 212, 312 and 412. Adjacent shelves may be connected by cables 500 having input and output connections, as illustrated in FIG. 2.

The same printed wiring backplane can be reproduced for each of the interface units. The printed wiring backplane includes cross-over connections to permit a single conventional 25 pin connector to be utilized to connect both common signals and unique signals between a central location and the interface circuit. In addition, the printed wiring backplane permits interface units that are connected together to share the same common signals for each of the interface units and to permit designated pins to transmit unique signals for each of the connected interface units. Thus, a single conventional cable may be utilized to connect interface its and connect common signals and unique signals to a central location.

Although a 25 pin connector is described herein, it is to be understood that any connector could be utilized in the present invention wherein a printed wiring backplane would be used to enable the connectors to transmit common signals and unique signals. In addition, although three common signals and five unique signals have been described with regard to each of the interface circuits, it is to be understood that any number of common signals and any number of unique signals can be used in connection with the present invention.

The 25 pin connectors positioned on the backplane may be used to connect any signal or may be used to connect miscellaneous alarm inputs such as the cabinet door alarm between a central location and an interface circuit. These signals will be connected to the interface unit slots.

The internal connections for the miscellaneous inputs are shown in FIGS. 1 and 2. To limit the number of cables to be run over to the cross-connect panel for signals, the input signals for a full bay are combined into a single cable. Of the 32 potential input signals to a bay, 3 are bussed to all four shelves for common signals that should be reflected on all shelves. Five unique signals are distributed to each of the four shelves. For the lowest cost, two connectors are provided on the backplane. One is the input connector while the other one is used to mult the connections to the next shelf. A translation scheme with printed paths on a multi-layer backplane are used to achieve the desired connection for the common and unique signals.

In describing the present invention, the interface unit consists of the equipment shelf, the interface circuit, the input connector and the output connector that includes a preselected printed wiring backplane to permit cross-over connections to permit a single pin connector to be utilized to connect both common signals and unique signals between a central location and the interface circuit. The cable utilized in the present invention is a straight through cable that could be a bundle cable or a ribbon cable. In addition, it is to be understood that the signals could be transmitted from an interface circuit to a central location or from a central location to an interface circuit.

The invention being thus described, it will be obvious that the same may be varied in many ways. Such variations are

TABLE 1

| Bay Cable Designation | Signal at Interface Circuit | | | |
|---|---|---|---|---|
| | Shelf 1 | Shelf 2 | Shelf 3 | Shelf 4 |
| SIGNAL 1 | Input 1 | Input 1 | Input 1 | Input 1 |
| SIGNAL 2 | Input 2 | Input 2 | Input 2 | Input 2 |
| SIGNAL 3 | Input 3 | Input 3 | Input 3 | Input 3 |
| SIGNAL 4 | Input 4 | | | |
| SIGNAL 5 | Input 5 | | | |
| SIGNAL 6 | Input 6 | | | |
| SIGNAL 7 | Input 7 | | | |
| SIGNAL 8 | Input 8 | | | |
| SIGNAL 9 | | Input 4 | | |
| SIGNAL 10 | | Input 5 | | |
| SIGNAL 11 | | Input 6 | | |
| SIGNAL 12 | | Input 7 | | |
| SIGNAL 13 | | Input 8 | | |
| SIGNAL 14 | | | Input 4 | |
| SIGNAL 15 | | | Input 5 | |
| SIGNAL 16 | | | Input 6 | |
| SIGNAL 17 | | | Input 7 | |
| SIGNAL 18 | | | Input 8 | |
| SIGNAL 19 | | | | Input 4 |
| SIGNAL 20 | | | | Input 5 |
| SIGNAL 21 | | | | Input 6 |
| SIGNAL 22 | | | | Input 7 |
| SIGNAL 23 | | | | Input 8 |

What is claimed is:

1. A connection arrangement for wiring a plurality of signals at an interface unit to a central location comprising:
    a cable having a plurality of wires, said cable having a first end and a second end;
    an input connection being mounted on one of said first end and said second end, said input connection including a plurality of pins corresponding to individual wires in said cable;
    an output connection being mounted on one of said second end and said first end, said output connection including a plurality of pins corresponding to individual wires in said cable; and
    the interface unit including:
        an input connector including a plurality of pins corresponding to preselected signals for the unit and an output connector including a plurality of pins corresponding to preselected signals for subsequent units to be ganged together; and
        a preselected printed wiring backplane for said input connection for defining the wires that are available in said input connection and said input connector enable a predetermined number of signals from the interface unit to be common signals and for enabling a predetermined number of signals from the interface unit to be unique signals for a particular interface unit.

2. The connection arrangement for wiring a plurality of signals at an interface unit to a central location according to claim 1, wherein a plurality of interface units are arranged relative to each other and said input connector of one interface unit is operatively connected to an output connector of a prior interface unit for enabling a predetermined number of signals from the plurality of interface units to be common signals and for enabling a predetermined number of signals from each interface unit to be unique signals for the particular interface unit.

3. The connection arrangement for wiring a plurality of signals at an interface unit to a central location according to claim 1, wherein said cable is a conventional 25 wire cable and said input and output connections are conventional 25 pin connections.

4. The connection arrangement for wiring a plurality of signals from an interface unit to a central location according to claim 2, wherein said preselected printed wiring backplane is formed on the interface unit.

5. The connection arrangement for wiring a plurality of signals at an interface unit to a central location according to claim 1, wherein said input connector defines three bay cable designations for common signals for the interface unit and defines five bay cable designations for unique signals for the interface unit.

6. A connection arrangement for wiring a plurality of signals from a plurality of interface units to a central location comprising:
    a plurality of interface units;
    an input connector being operatively mounted on each of said interface units;
    an output connector being operatively mounted on each of said interface units;
    said input connector including a plurality of pins corresponding to preselected signals for the interface units;
    said output connector including a plurality of pins corresponding to preselected signals for subsequent interface units to be ganged together; and
    a preselected printed wiring backplane connection for said input connectors for defining pins that are available in said input connection to enable a predetermined number of signals from the interface unit to be common signals and for enabling a predetermined number of signals from the interface unit to be unique signals for a particular interface unit.

7. The connection arrangement for wiring a plurality of signals from a plurality of interface units to a central location according to claim 6, wherein said preselected printed wiring backplane is formed on a printed wiring board backplane of each interface unit.

8. The connection arrangement for wiring a plurality of signals from a plurality of interface units to a central location according to claim 6, wherein said input connector and said output connector are conventional 25 pin connectors.

9. The connection arrangement for wiring a plurality of signals from a plurality of interface units to a central location according to claim 6, wherein said plurality of interface units are arranged relative to each other and said input connector of one interface unit is operatively connected to an output connector of a prior interface unit for enabling a predetermined number of signals from the plurality of interface units to be common signals and for enabling a predetermined number of signals from each interface unit to be unique signals for the particular interface unit.

10. The connection arrangement for wiring a plurality of signals from a plurality of interface units to a central location according to claim 6, wherein said input connector defines three bay cable designations for common signals for each interface unit and defines five bay cable designations for unique signals for each interface unit.

11. An input and output connector for connecting a plurality of signals at an interface circuit to a central location comprising:
    an input connector for connecting an interface circuit to a central location, said input connector and said interface circuit being mounted on a first equipment shelf;

an output connector for connecting a subsequent equipment shelf to a central location;

said input connector including a plurality of pins corresponding to preselected signals for the interface circuit;

said output connector including a plurality of pins corresponding to preselected signals for the subsequent equipment shelf to be ganged together; and a preselected printed wiring backplane for said input connector for defining the wires that are available in said input connector to enable a predetermined number of signals from the interface circuit to be common signals and for enabling a predetermined number of signals to be unique signals for a particular equipment shelf.

12. The input and output connector for connecting a plurality of signals at an interface unit to a central location according to claim 11, wherein said preselected printed wiring backplane is formed on a printed wiring board backplane of each interface circuit mounted on a particular equipment shelf.

13. The input and output connector for connecting a plurality of signals at an interface unit to a central location according to claim 11, wherein said input connector and said output connector are conventional 25 pin connectors.

14. The input and output connector for connecting a plurality of signals at an interface unit to a central location according to claim 11, wherein a plurality of interface circuits are arranged relative to each other on equipment shelves and said input connector of one interface circuit is operatively connected to an output connector of a prior interface circuit for enabling a predetermined number of signals from the plurality of interface circuits to be common signals and for enabling a predetermined number of signals from each interface circuit to be unique signals for the particular equipment shelf.

15. The input and output connector for connecting a plurality of signals at an interface circuit to a central location according to claim 11, wherein said input connector defines three bay cable designations for common signals for each interface circuit and defines five bay cable designations for unique signals for each equipment shelf.

* * * * *